(12) United States Patent
Kim et al.

(10) Patent No.: US 9,965,405 B2
(45) Date of Patent: May 8, 2018

(54) INITIAL ENUMERATION OF EMPTY ENDPOINT SLOTS USING ENDPOINT EMULATION

(71) Applicant: Ardent Storage, Inc., San Jose, CA (US)

(72) Inventors: Daniel Song Kim, Cupertino, CA (US); Thomas Chang Han, Campbell, CA (US); Jeong Pyo Lee, Siheung-si (KR)

(73) Assignee: Ardent Storage, Inc., San Jose, CA (US)

( * ) Notice: Subject to any disclaimer, the term of this patent is extended or adjusted under 35 U.S.C. 154(b) by 131 days.

(21) Appl. No.: 15/181,379

(22) Filed: Jun. 13, 2016

(65) Prior Publication Data

US 2016/0365155 A1    Dec. 15, 2016

Related U.S. Application Data

(60) Provisional application No. 62/175,406, filed on Jun. 14, 2015.

(51) Int. Cl.
*G06F 11/00* (2006.01)
*G06F 13/10* (2006.01)
(Continued)

(52) U.S. Cl.
CPC ........ *G06F 13/105* (2013.01); *G06F 13/4022* (2013.01); *G06F 13/4081* (2013.01);
(Continued)

(58) Field of Classification Search
CPC .. G06F 13/105; G06F 13/102; G06F 13/4022; G06F 13/4081; G06F 17/50; G06F 17/5009
See application file for complete search history.

(56) References Cited

U.S. PATENT DOCUMENTS 5,715,433 A * 2/1998 Raghavan ............. G06F 11/221
                                                         703/13
5,751,975 A * 5/1998 Gillespie ............... G06F 13/105
                                                         370/402

(Continued)

OTHER PUBLICATIONS

Budruk, R., Anderson, D., and Shanley, T., PCI Express System Architecture, Addison-Wesley Developer's Press.

*Primary Examiner* — Bryce P Bonzo
*Assistant Examiner* — Jonathan D Gibson
(74) *Attorney, Agent, or Firm* — Patrick E. Caldwell, Esq.; The Caldwell Firm, LLC

(57) ABSTRACT

Embodiments of the present disclosure are directed to a system comprising a processing unit executing an enumeration process over a high performance I/O network having endpoint locations that can be populated with endpoint devices. The system further comprises endpoint emulators to represent endpoint devices at endpoint locations unpopulated during the enumeration process. The system facilitates accessing certain endpoint devices later inserted (e.g., hot plugged) into the endpoint locations that were unpopulated during the enumeration process. The endpoint emulators can be implemented using various techniques, such as cards plugged into card slots coupled to the endpoint locations, or emulation software and/or firmware exposed to the processing unit. In an embodiment, the system is a test system for testing endpoint devices (e.g., PCIe SSDs), which test system can facilitate hot plugging of units under test in test slots that were unpopulated during the enumeration process.

20 Claims, 12 Drawing Sheets

(51) Int. Cl.
*G06F 13/40* (2006.01)
*G06F 17/50* (2006.01)
*G11C 29/56* (2006.01)

(52) U.S. Cl.
CPC .......... *G06F 17/50* (2013.01); *G06F 17/5009* (2013.01); *G11C 29/56* (2013.01); *G11C 29/56016* (2013.01)

(56) References Cited

U.S. PATENT DOCUMENTS

| | | | |
|---|---|---|---|
| 6,442,514 B1* | 8/2002 | Le | G06F 11/261 703/13 |
| 6,484,281 B1* | 11/2002 | Wang | G01R 31/318342 714/733 |
| 6,629,157 B1* | 9/2003 | Falardeau | G06F 13/4027 703/25 |
| 6,820,219 B1* | 11/2004 | Huang | G06F 11/263 703/20 |
| 6,980,944 B1* | 12/2005 | Oshins | G06F 17/5022 703/17 |
| 7,260,749 B2* | 8/2007 | Cox | G06F 11/0745 710/100 |
| 7,983,888 B2* | 7/2011 | Evoy | G06F 13/4022 703/14 |
| 8,103,993 B2* | 1/2012 | Atherton | G06F 13/4022 716/100 |
| 2003/0023791 A1* | 1/2003 | Suzuki | G06F 13/102 710/62 |
| 2004/0236564 A1* | 11/2004 | Oshins | G01R 31/318357 703/25 |
| 2007/0136504 A1* | 6/2007 | Wu | G06F 13/4081 710/302 |
| 2011/0145558 A1* | 6/2011 | Khosravi | G06F 9/4416 713/2 |

* cited by examiner

INITIAL ENUMERATION OF EMPTY ENDPOINT SLOTS USING ENDPOINT EMULATION

RELATED APPLICATIONS

The present application claims the benefit of priority to co-pending U.S. Patent Application Ser. No. 62/175,406, entitled "INITIAL ENUMERATION OF EMPTY ENDPOINT SLOTS USING ENDPOINT EMULATION", filed 14 Jun. 2015, which is hereby incorporated by reference in its entirety.

FIELD

This disclosure relates to the field of testing electronic systems and more particularly to techniques for initial enumeration of empty endpoint slots using endpoint emulation.

BACKGROUND

As the price-performance gap between dynamic random access memory (DRAM) and hard disk drives (HDDs) in computing systems continues to widen, non-volatile memory (NVM) solutions are increasingly filling that gap. Specifically, NVM in the form of solid state drives (SSDs) is creating a new I/O (input/output or IO) memory tier in today's computing systems. In addition, PCI Express (PCIe) connectivity in computing systems continues to rise, providing a high performance I/O interface (e.g., 1 GBps per lane for PCIe Gen3) to various devices, such as SSDs. For example, a single PCIe Gen3 SSD device with 8 lanes can deliver over 6 GBps of data access bandwidth. SSD providers, in an attempt to participate in this growing market opportunity, are introducing SSD products at a rapid pace. While there exists some standardization pertaining to the interoperability of PCIe SSDs (e.g., the NVM Express or NVMe standard), there remains a wide variety of implementations and drivers among today's SSD devices. Such SSD device variability can impact testing of SSD devices. For example, the test system mechanical and/or electrical interface for an SSD device under test (DUT) or a unit under test (UUT) might need to comply with the specific interface implemented in the UUT.

Unfortunately, legacy techniques for implementing test systems that accommodate the varying UUTs can be limited at least as pertaining to UUT insertion and removal while the test system is powered on. Such "hot plug" capability can specifically be limited in legacy implementations of test systems for PCIe SSDs and/or other SSDs using other high performance I/O networks and interfaces. For example, while PCIe devices and systems can be implemented so as to support hot plug capability for the devices, such devices and systems expect a device (e.g., endpoint device) to be present in all endpoint locations (e.g., card connectors or card slots) to be later used when the system is initialized. More specifically, the enumeration process invoked at system initialization (e.g., system boot) expects an endpoint device to be present in a given slot (e.g., bus number) at the time of initialization in order for any other hot plugged device to be accessible in that slot at a moment in time following completion of the enumeration process. One legacy approach to this limitation in test systems is to fill all the test slots with UUTs and/or dummy UUTs during system initialization. However, for test systems comprising a large number (e.g., 256, 512, etc.) of test slots for parallel testing, this can consume substantial computing and/or human resources, and/or hardware costs.

Techniques are therefore needed address the problem of efficiently implementing hot plug capable test slots in a test system, enabling the advancement of high performance I/O device test systems, non-volatile memory test systems, and other electronic systems. None of the aforementioned legacy approaches achieve the capabilities of the herein-disclosed techniques for initial enumeration of empty endpoint slots using endpoint emulation. Therefore, there is a need for improvements.

SUMMARY

The present disclosure provides a detailed description of techniques used in methods, systems, and computer program products for initial enumeration of empty endpoint slots using endpoint emulation, which techniques advance the relevant technologies to address technological issues with legacy approaches. Specifically, certain embodiments are directed to approaches for emulating a test device endpoint at each empty test slot during test system initialization to facilitate hot plug capable test slots for testing of various devices, which embodiments advance the relevant technical fields as well as advancing peripheral technical fields. In particular, the herein disclosed techniques provide technical solutions that address the technical problems attendant to efficiently implementing hot plug capable test slots in a test system.

Some embodiments of the present disclosure are directed to a system comprising a processing unit executing an enumeration process over a high performance I/O network having endpoint locations that can be populated with endpoint devices. The system further comprises endpoint emulators to represent endpoint devices at endpoint locations unpopulated during the enumeration process. The system facilitates accessing certain endpoint devices later inserted (e.g., hot plugged) into the endpoint locations that were unpopulated during the enumeration process. In one or more embodiments, the system further comprises switch cards coupled to the endpoint locations and the endpoint emulators. In certain embodiments, the endpoint emulators comprise hardware, such as a card plugged into an emulator slot. In certain embodiments, the endpoint emulators comprise firmware. In an embodiment, the system is a test system for testing endpoint devices (e.g., PCIe SSDs), which test system can facilitate hot plugging of units under test in test slots that were unpopulated during the enumeration process.

Further details of aspects, objectives, and advantages of the disclosure are described below and in the detailed description, drawings, and claims. Both the foregoing general description of the background and the following detailed description are exemplary and explanatory, and are not intended to be limiting as to the scope of the claims.

BRIEF DESCRIPTION OF THE DRAWINGS

The drawings described below are for illustration purposes only. The drawings are not intended to limit the scope of the present disclosure.

DETAILED DESCRIPTION

Figure 1:
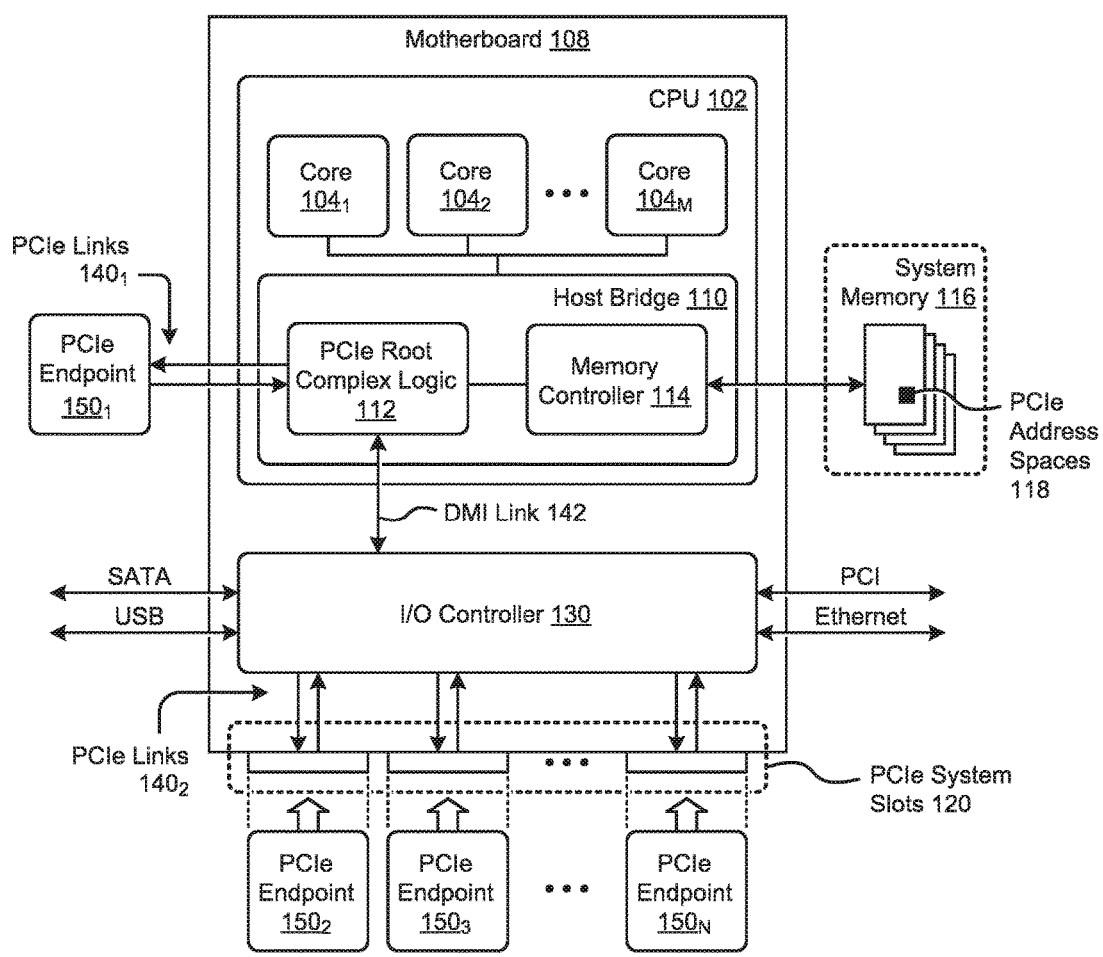
FIG. 1 is a diagram of a computing system that includes high performance I/O devices.

Some embodiments of the present disclosure address the problem of efficiently implementing hot plug capable test slots in a test system and some embodiments are directed to approaches for emulating a test device endpoint at each empty test slot during test system initialization to facilitate hot plug capable test slots for testing of various devices. More particularly, disclosed herein and in the accompanying figures are exemplary environments, methods, and systems for initial enumeration of empty endpoint slots using endpoint emulation.

Overview

Disclosed herein are techniques for emulating a test device endpoint at each empty test slot during test system initialization to facilitate hot plug capable test slots for testing of various devices. In one or more embodiments, a system (e.g., test system) comprising a processing unit can execute an enumeration process over a high performance I/O network having endpoint locations that can be populated with endpoint devices. The system can comprise endpoint emulators to represent endpoint devices at endpoint locations unpopulated during the enumeration process. The system facilitates accessing certain endpoint devices later inserted (e.g., hot plugged) into the endpoint locations that were unpopulated during the enumeration process. In certain embodiments, the system can further comprise switch cards coupled to the endpoint locations and the endpoint emulators. For example, the switch cards can fan out the communications links from the processing unit to the endpoint locations. In certain embodiments, the endpoint emulators comprise hardware, such as a card plugged into an emulator slot. In certain embodiments, the endpoint emulators comprise firmware. In certain embodiments, the system is a test system for testing endpoint devices (e.g., PCIe SSDs), which test system can facilitate hot plugging of units under test in test slots that were unpopulated during the enumeration process.

Various embodiments are described herein with reference to the figures. It should be noted that the figures are not necessarily drawn to scale and that elements of similar structures or functions are sometimes represented by like reference characters throughout the figures. It should also be noted that the figures are only intended to facilitate the description of the disclosed embodiments—they are not representative of an exhaustive treatment of all possible embodiments, and they are not intended to impute any limitation as to the scope of the claims. In addition, an illustrated embodiment need not portray all aspects or advantages of usage in any particular environment.

An aspect or an advantage described in conjunction with a particular embodiment is not necessarily limited to that embodiment and can be practiced in any other embodiments even if not so illustrated. Also, references throughout this specification to "some embodiments" or "other embodiments" or "certain embodiments" refers to a particular feature, structure, material or characteristic described in connection with the embodiments as being included in at least one embodiment. Thus, the appearance of the phrases "in some embodiments" or "in other embodiments" or "certain embodiments" in various places throughout this specification are not necessarily referring to the same embodiment or embodiments.

Definitions

Some of the terms used in this description are defined below for easy reference. The presented terms and their respective definitions are not rigidly restricted to these definitions—a term may be further defined by the term's use within this disclosure.

The term "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

As used in this application and the appended claims, the term "or" is intended to mean an inclusive "or" rather than an exclusive "or". That is, unless specified otherwise, or is clear from the context, "X employs A or B" is intended to mean any of the natural inclusive permutations. That is, if X employs A, X employs B, or X employs both A and B, then "X employs A or B" is satisfied under any of the foregoing instances.

The articles "a" and "an" as used in this application and the appended claims should generally be construed to mean "one or more" unless specified otherwise or is clear from the context to be directed to a singular form.

The term "logic" means any combination of software or hardware that is used to implement all or part of the disclosure.

The term "non-transitory computer readable medium" refers to any medium that participates in providing instructions to a logic processor.

A "module" includes any mix of any portions of computer memory and any extent of circuitry including circuitry embodied as a processor.

Reference is now made in detail to certain embodiments. The disclosed embodiments are not intended to be limiting of the claims.

Descriptions of Exemplary Embodiments

FIG. 1 is a diagram of a computing system 100 that includes high performance I/O devices. As an option, one or more instances of computing system 100 or any aspect thereof may be implemented in the context of the architecture and functionality of the embodiments described herein. Also, the computing system 100 or any aspect thereof may be implemented in any desired environment.

As shown in FIG. 1, the computing system 100 is an example of a PCIe-based computing system comprising a CPU 102, an I/O controller 130, system memory 116, and a plurality of PCIe endpoints (e.g., PCIe endpoint $150_1$, PCIe endpoint $150_2$, PCIe endpoint $150_3$, ..., PCIe endpoint $150_N$). The CPU 102 further comprises a plurality of processing cores (e.g., core $104_1$, core $104_2$, ..., core $104_M$) and a host bridge 110 that includes certain instances of PCIe root complex logic 112 and a memory controller 114.

The plurality of PCIe endpoints can communicate with the PCIe root complex logic 112 directly (e.g., PCIe endpoint $150_1$ communicating through PCIe links $140_1$), or through a direct media interface link (e.g., DMI link 142) and I/O controller 130 (e.g., see PCIe endpoint $150_2$, PCIe endpoint $150_3$, ..., PCIe endpoint $150_N$ communicating through PCIe links $140_2$). For example, PCIe endpoint $150_1$ might be a high performance GPU that is connected directly to the PCIe root complex logic 112. In some cases, one or more PCIe endpoints (e.g., PCIe endpoint $150_2$, PCIe endpoint $150_3$, ..., PCIe endpoint $150_N$) can be cards plugged into respective card slots, such as the PCIe system slots 120 on a motherboard 108. In other cases, one or more PCIe endpoints can be peripheral cards that use external connectors to connect to the I/O controller 130. As shown, the I/O controller 130 can further provide an interface for other communication protocols (e.g., SATA, USB, PCI, Ethernet, LPC, etc.). Further, the chipset (e.g., CPU 102 and I/O controller 130) can support communications (e.g., packet routing) between PCIe endpoints, PCI devices (e.g., via the PCI link), the system memory 116, and other system components.

As shown, the PCIe root complex logic 112 can be integrated into the CPU 102 as part of the host bridge 110. As another example, the PCIe root complex logic 112 can be implemented as part of a "north bridge" in systems that partition the chipset logic into two physical chips. Other partitioning is possible. More specifically, the PCIe root complex logic 112 can connect the PCIe fabric (e.g., PCIe network or topology comprising bridges, switches, links, devices, etc.) to the system memory 116 and the CPU 102. For example, the PCIe root complex logic 112 can connect to the PCIe fabric through one or more logical ports referred to as root ports. In some cases, such logical ports can be implemented physically in one or more chips outside the chip (e.g., CPU 102) comprising the PCIe root complex logic 112.

The plurality of PCIe endpoints can comprise PCIe devices that terminate a given PCIe link. As such, a PCIe endpoint can be described as having merely one connection (e.g., upstream connection) to the PCIe topology. Each PCIe device resides on a bus within the PCIe fabric and contains one or more functions (e.g., a maximum of eight functions). As an example, one function can be a graphics controller and another function can be a network interface. The PCIe topology can further comprise bridges (e.g., PCIe-to-PCI bridge, bridge to a low pin count or LPC bus, etc.) and switches. Specifically, such switches can comprise a device that connects two or more PCIe links.

When PCIe-based computing systems such as computing system 100 are first powered up (e.g., at system boot), certain program instructions (e.g., configuration software) can be invoked (e.g., at CPU 102) to scan the PCIe fabric and discover how the topology is populated (e.g., identify the buses, devices, endpoints, functions, etc.). Such a discovery process can be referred to as an enumeration process. At a moment in time prior to the execution and completion of the enumeration process, for example, the computing system 100 might merely be aware of the existence of the host bridge 110 and the PCIe root complex logic 112. Among other operations, the enumeration process can invoke configuration transactions that facilitate defining and/or allocating certain instances of PCIe address spaces 118 to, at least in part, facilitate address routing among the identified PCIe endpoints. For example, the PCIe address spaces 118 can comprise a PCIe configuration space, a PCIe memory space, a PCIe I/O space, and a PCIe message space. Other computing systems comprising other high performance I/O networks and protocols can also have enumeration requirements.

When one or more PCIe endpoints are not present during the enumeration process, the respective locations in the PCIe fabric cannot be used without cycling the power on the computing system and invoking again the enumeration process with such locations populated (e.g., with a PCIe endpoint). For example, if the card represented by PCIe endpoint $150_2$ was not inserted into the respective card slot included in PCIe system slots 120 during initialization and/or execution of the enumeration process, the PCIe endpoint $150_2$ might not be accessible by the computing system when hot plugged into the respective card slot following completion of the enumeration process.

As earlier mentioned, this limitation can precipitate problems attendant to efficiently implementing hot plug capable test slots in test systems for PCIe devices (e.g., PCIe SSDs) and/or other high performance I/O devices. Such a test system is shown and described as pertaining to FIG. 2.

Figure 2:
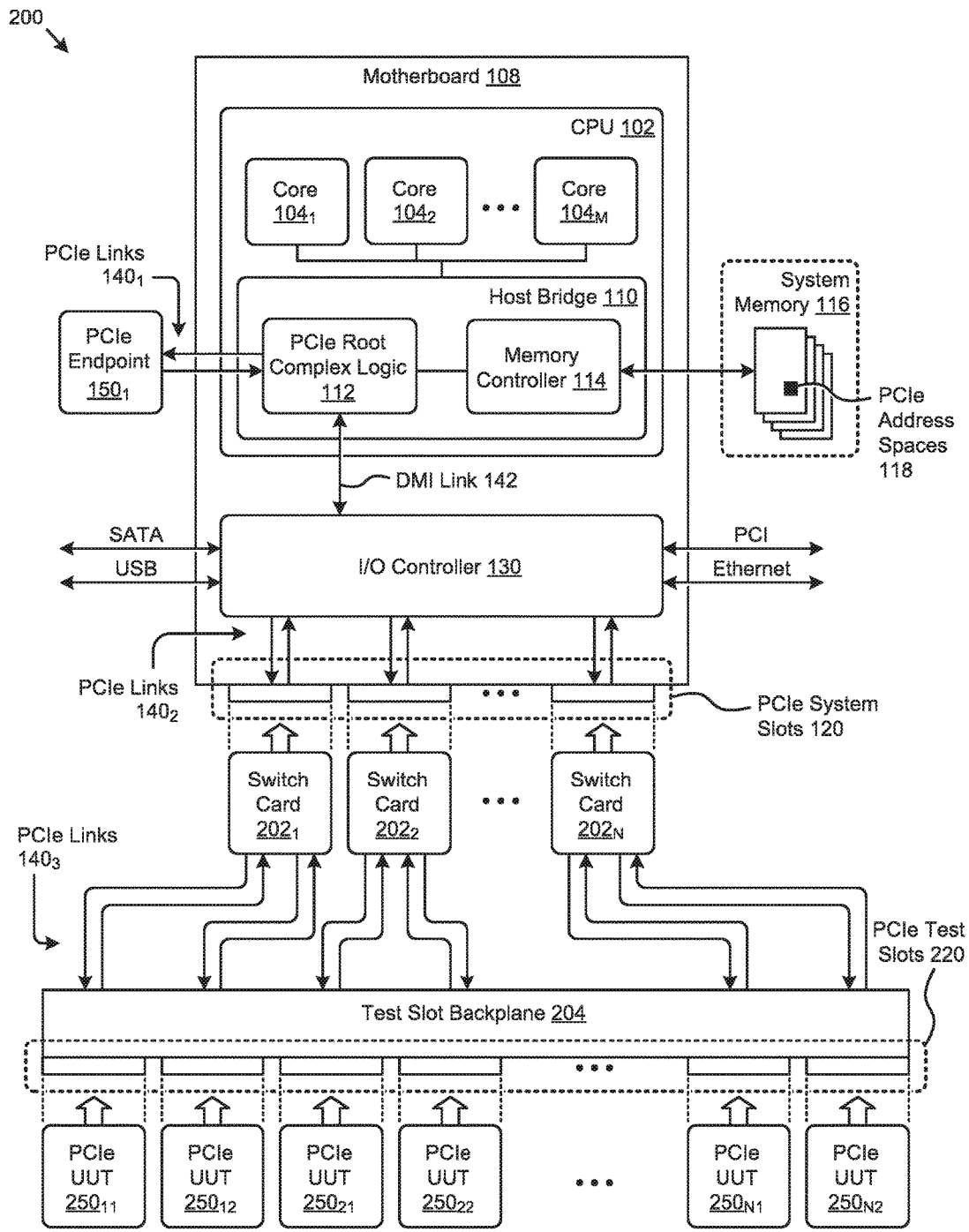
FIG. 2 presents a block diagram of a device test system for testing high performance I/O devices, according to some embodiments.

FIG. 2 presents a block diagram of a device test system 200 for testing high performance I/O devices. As an option, one or more instances of device test system 200 or any aspect thereof may be implemented in the context of the architecture and functionality of the embodiments described herein. Also, the device test system 200 or any aspect thereof may be implemented in any desired environment.

As shown in FIG. 2, the device test system 200 comprises the computing system 100 earlier shown and described in FIG. 1. Device test system 200 further comprises a plurality of PCIe switch cards (e.g., switch card $202_1$, switch card $202_2$, ..., switch card $202_N$) plugged into the PCIe system slots 120. The PCIe switch cards can fan out the PCIe links $140_2$ to a larger number of PCIe links $140_3$ that are coupled to a test slot backplane 204 comprising multiple instances of PCIe test slots 220. For example, as shown, the PCIe switch cards produce a 2:1 ratio of PCIe links $140_3$ to PCIe links $140_2$. Each instance of the PCIe test slots 220 can then be used to test a respective one of a plurality of PCIe device UUTs (e.g., PCIe UUT $250_{11}$, PCIe UUT $250_{12}$, PCIe UUT $250_{21}$, PCIe UUT $250_{22}$, ..., PCIe UUT $250_{N1}$, PCIe UUT $250_{N2}$). In some cases, all of the PCIe test slots 220 might be populated at initialization of the device test system 200 to facilitate availability of hot plug capable test slots (e.g., PCIe test slots 220) for testing UUTs (e.g., PCIe UUTs).

For test systems comprising a large number of test slots (e.g., 512 test slots for parallel testing), populating all test slots at initialization can consume substantial computing and/or human resources, and/or hardware costs. The herein disclosed techniques can address such problems attendant to efficiently implementing hot plug capable test slots in a test system without populating the test slots at initialization. Such techniques are shown and described herein and as pertains to FIG. 3A and FIG. 3B.

Figure 3A:
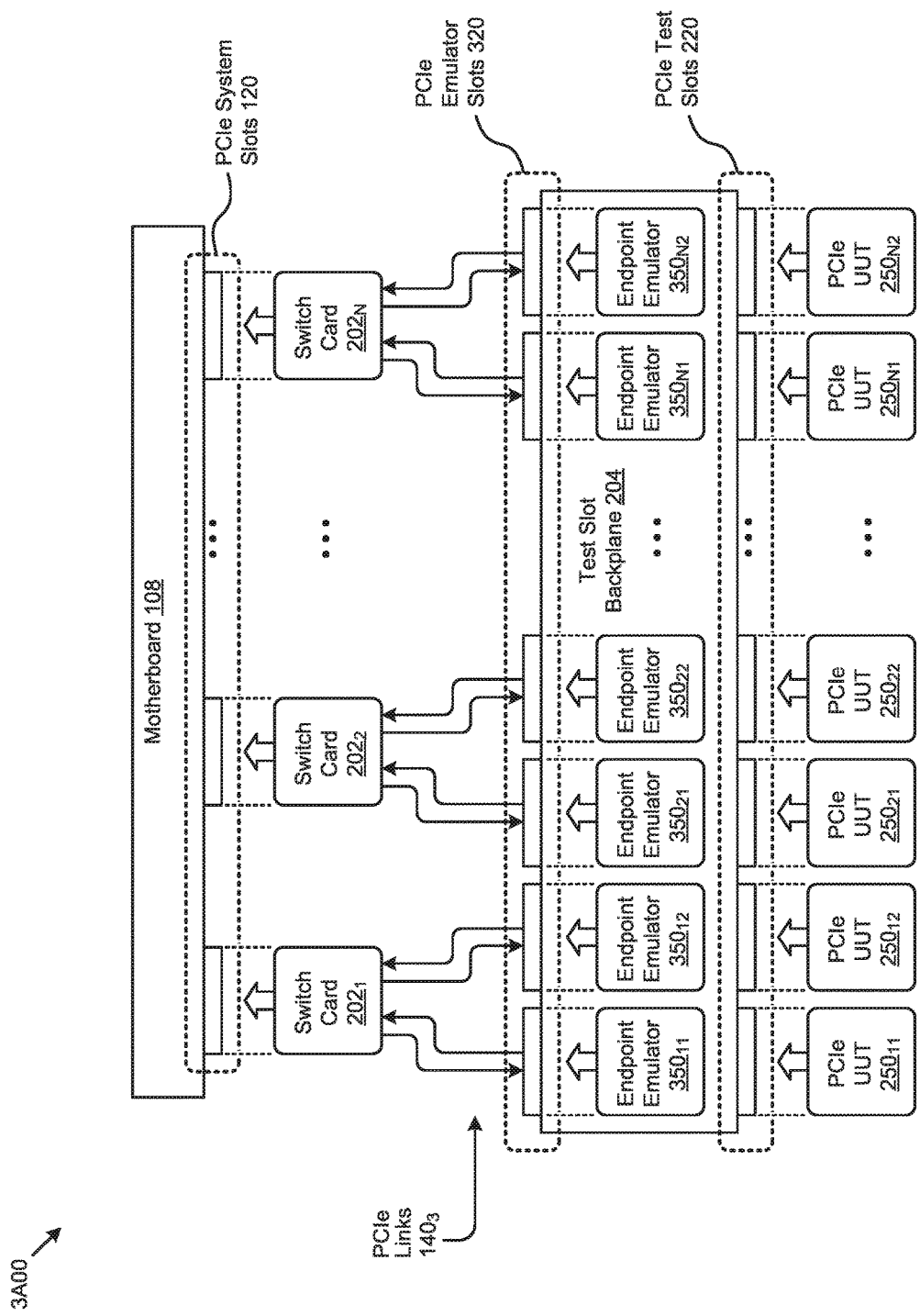
FIG. 3A depicts a mini-slot endpoint emulation technique as used in systems for initial enumeration of empty endpoint slots using endpoint emulation, according to some embodiments.

FIG. 3A depicts a mini-slot endpoint emulation technique 3A00 as used in systems for initial enumeration of empty endpoint slots using endpoint emulation. As an option, one or more instances of mini-slot endpoint emulation technique 3A00 or any aspect thereof may be implemented in the context of the architecture and functionality of the embodiments described herein. Also, the mini-slot endpoint emulation technique 3A00 or any aspect thereof may be implemented in any desired environment.

FIG. 3A depicts a portion of the device test system 200 earlier described in FIG. 2 comprising the PCIe system slots 120 coupled to the motherboard 108, the PCIe switch cards (e.g., switch card $202_1$, switch card $202_2$, . . . , switch card $202_N$), the test slot backplane 204, the PCIe test slots 220, and the plurality of PCIe device UUTs (e.g., PCIe UUT $250_{11}$, PCIe UUT $250_{12}$, PCIe UUT $250_{21}$, PCIe UUT $250_{22}$, . . . , PCIe UUT $250_{N1}$, PCIe UUT $250_{N2}$). To facilitate the mini-slot endpoint emulation technique 3A00 according to the herein disclosed techniques, FIG. 3A further illustrates a plurality of PCIe endpoint emulators (e.g., endpoint emulator $350_{11}$, endpoint emulator $350_{12}$, endpoint emulator $350_{21}$, endpoint emulator $350_{22}$, . . . , endpoint emulator $350_{N1}$, endpoint emulator $350_{N2}$). In one or more embodiments, the plurality of PCIe endpoint emulators can comprise cards that can be plugged into a respective one of the card slots represented by the PCIe emulator slots 320. For example, the cards might be PCIe mini cards and the card slots might be PCIe M.2 slots.

In the mini-slot endpoint emulation technique 3A00 shown, the plurality of PCIe endpoint emulators can be inserted into the PCIe emulator slots 320 to represent or "emulate" an endpoint device at a respective one of the PCIe test slots 220 during the enumeration process. More specifically, according to the herein disclosed techniques, each instance of the PCIe emulator slots 320 can be coupled to a respective instance of the PCIe test slots 220, which PCIe test slots can be unpopulated during enumeration. In such cases, the test system can discover the PCIe endpoint emulators at the PCIe emulator slots 320 during enumeration to facilitate testing of various endpoint devices (e.g., the PCIe UUTs) that can be hot plugged into the PCIe test slots 220 at a moment in time following completion of the enumeration process.

In some cases, when enumeration and/or configuration of the PCIe test slots 220 has completed, the plurality of PCIe endpoint emulators can be disabled so as to not conflict with any PCIe devices (e.g., UUTs) present in the PCIe test slots 220. For example, the PCIe endpoint emulators can be disabled according to a "safe removal" process as defined in a high performance I/O specification. In one or more embodiments, an instance of the plurality of PCIe endpoint emulators can be enabled or active when there is no PCIe device present in a respective instance of the PCIe test slots 220.

Figure 3B:
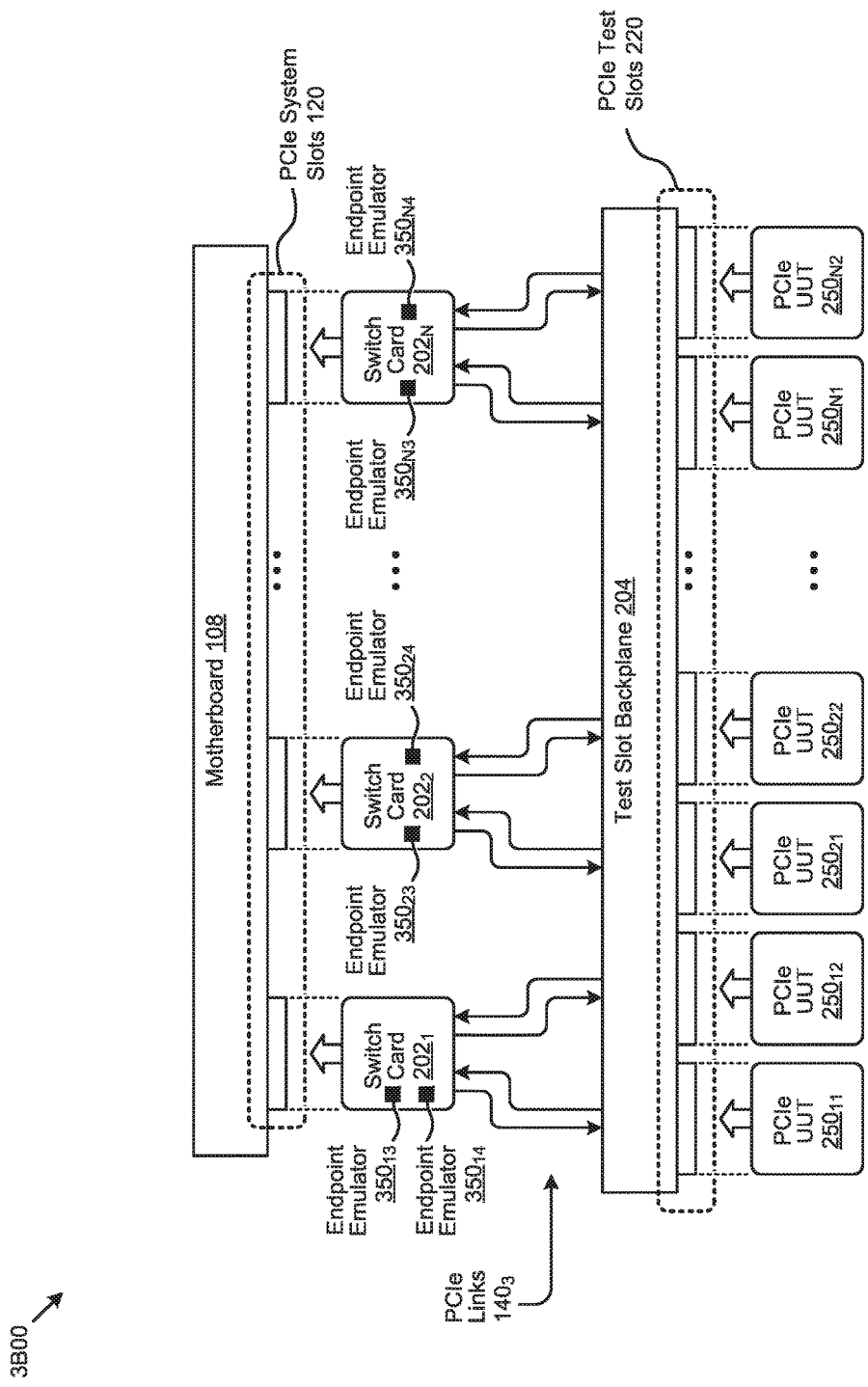
FIG. 3B depicts a switch card endpoint emulation technique as used in systems for initial enumeration of empty endpoint slots using endpoint emulation, according to some embodiments.

Another embodiment and technique for initial enumeration of empty endpoint slots using endpoint emulation is shown and described as pertaining to FIG. 3B.

FIG. 3B depicts a switch card endpoint emulation technique 3B00 as used in systems for initial enumeration of empty endpoint slots using endpoint emulation. As an option, one or more instances of switch card endpoint emulation technique 3B00 or any aspect thereof may be implemented in the context of the architecture and functionality of the embodiments described herein. Also, the switch card endpoint emulation technique 3B00 or any aspect thereof may be implemented in any desired environment.

FIG. 3B depicts a portion of the device test system 200 earlier described in FIG. 2 comprising the PCIe system slots 120 coupled to the motherboard 108, the PCIe switch cards (e.g., switch card $202_1$, switch card $202_2$, . . . , switch card $202_N$), the test slot backplane 204, the PCIe test slots 220, and the plurality of PCIe device UUTs (e.g., PCIe UUT $250_{11}$, PCIe UUT $250_{12}$, PCIe UUT $250_{21}$, PCIe UUT $250_{22}$, . . . , PCIe UUT $250_{N1}$, PCIe UUT $250_{N2}$). To facilitate the switch card endpoint emulation technique 3B00 according to the herein disclosed techniques, FIG. 3B further illustrates a plurality of PCIe endpoint emulators (e.g., endpoint emulator $350_{13}$, endpoint emulator $350_{14}$, endpoint emulator $350_{23}$, endpoint emulator $350_{24}$, . . . , endpoint emulator $350_{N3}$, endpoint emulator $350_{N4}$) that can be implemented in the plurality of PCIe switch cards as shown. In one or more embodiments, the plurality of PCIe endpoint emulators can comprise one or more chips integrated into the switch card such that the PCIe endpoint emulators can be identified as PCIe endpoint devices. In certain embodiments, the plurality of PCIe endpoint emulators can comprise certain program instructions (e.g., emulation software, emulation firmware, etc.) that can emulate PCIe endpoint devices.

In the switch card endpoint emulation technique 3B00 shown, the plurality of PCIe endpoint emulators can represent or "emulate" an endpoint device at a respective one of the PCIe test slots 220 during the enumeration process. More specifically, according to the herein disclosed techniques, each instance of the PCIe endpoint emulators can be associated with a respective instance of the PCIe test slots 220, which PCIe test slots can be unpopulated during enumeration. In such cases, the test system can discover the plurality of PCIe endpoint emulators during enumeration to facilitate testing of various endpoint devices (e.g., the PCIe UUTs) that can be hot plugged into the PCIe test slots 220 at a moment in time following completion of the enumeration process. In some cases, when enumeration and/or configuration of the PCIe test slots 220 has completed, the plurality of PCIe endpoint emulators can be disabled so as to not conflict with any PCIe devices (e.g., UUTs) present in the PCIe test slots 220. For example, the PCIe endpoint emulators can be disabled according to a "safe removal" process as defined in a high performance I/O specification.

In one or more embodiments, an instance of the plurality of PCIe endpoint emulators can be enabled or active when there is no PCIe device present in a respective instance of the PCIe test slots 220. More details regarding the aforementioned PCIe endpoint emulators are shown and disclosed as pertains to FIG. 4.

Figure 4:
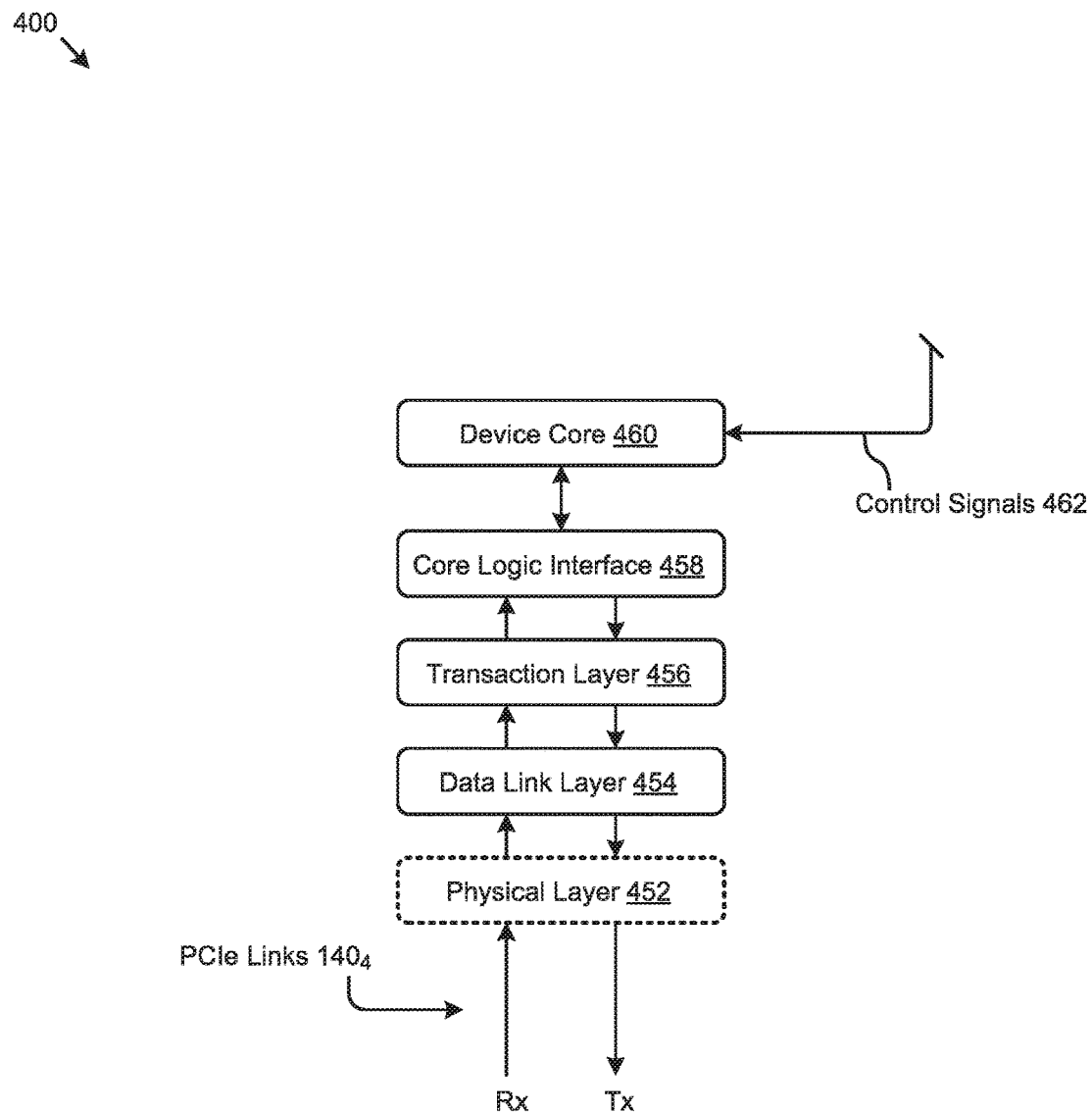
FIG. 4 is a block diagram of an emulated endpoint used in systems for initial enumeration of empty endpoint slots using endpoint emulation, according to an embodiment.

FIG. 4 is a block diagram of an endpoint emulator 400 used in systems for initial enumeration of empty endpoint slots using endpoint emulation. As an option, one or more instances of endpoint emulator 400 or any aspect thereof may be implemented in the context of the architecture and functionality of the embodiments described herein. Also, the endpoint emulator 400 or any aspect thereof may be implemented in any desired environment.

In certain embodiments, the endpoint emulator 400 can represent one or more of the aforementioned endpoint emulators (e.g., endpoint emulator $350_{11}$, endpoint emulator $350_{12}$, endpoint emulator $350_{21}$, endpoint emulator $350_{22}$, ..., endpoint emulator $350_{N1}$, endpoint emulator $350_{N2}$ from FIG. 3A, and endpoint emulator $350_{13}$, endpoint emulator $350_{14}$, endpoint emulator $350_{23}$, endpoint emulator $350_{24}$, ..., endpoint emulator $350_{N3}$, endpoint emulator $350_{N4}$ from FIG. 3B). Specifically, the endpoint emulator 400 is shown to comprise a physical layer 452, a data link layer 454, a transaction layer 456, a core logic interface 458, and a device core 460. The endpoint emulator 400 further can be coupled to one or more PCIe links $140_4$ to transmit (e.g., Tx) and receive (e.g., Rx) data through a high performance I/O connection and protocol (e.g., PCIe network or fabric). In certain embodiments, the endpoint emulator can also receive certain control signals 462 (e.g., for enabling or disabling the endpoint emulator 400).

The shown layers of the endpoint emulator 400 can be logically associated with the various communication layers implemented by the PCIe protocol. Specifically, the physical layer 452, the data link layer 454, and the transaction layer 456 can be associated with abstraction levels (e.g., lowest to highest, respectively) of the data packets communicated over the PCIe links $140_4$. More specifically, the transaction layer 456 can construct a transaction layer packet (TLP) comprising a TLP header and/or certain data content. The source of the data content can be the device core 460 and/or the core logic interface 458. As an example, the TLP can travel through the PCIe network or fabric, passing through one or more PCIe devices between the source and the destination device.

Also, the data link layer 454 can construct a data link layer packet (DLLP) that wraps the TLP in another header. As an example, the DLLP might travel between PCIe devices directly connected to each other through a PCIe link. Further, the physical layer 452 can construct one or more physical layer packets (PLPs) that can wrap around the DLLP (e.g., depending on the size of the DLLP). For example, if the size of the DLLP does not fit into a single PLP, the physical layer 452 logic can divide the DLLP into several frames of PLPs. The PLPs and/or PLP frames can be transmitted in the link (e.g., PCIe links $140_4$) between two connected PCIe devices.

As pertains to the herein disclosed techniques, the endpoint emulator 400 is used to emulate an endpoint device at a certain location (e.g., test slot) during enumeration. The endpoint emulator might then be removed and/or disabled from the PCIe fabric at some later moment in time following completion of the enumeration process. For example, the endpoint emulator 400 can be disabled when an endpoint device is present at the enumerated location of the endpoint emulator 400 (e.g., the UUT is inserted into the test slot). Further, the endpoint emulator 400 can be enabled (e.g., active) when an endpoint device is not present at the enumerated location of the endpoint emulator 400 (e.g., the UUT is removed from the test slot). Such emulation can comprise allocating address memory for the given location (e.g., bus, device, function, etc.).

Other emulation capabilities and operations are possible. In some cases and embodiments, an endpoint emulator implemented according to the herein disclosed techniques can have other components and partitions (e.g., layers, cores, etc.) while conforming to the subject communication protocol (e.g., high performance I/O protocol) for which emulation is desired. For example, the endpoint emulator 400 might not include the physical layer 452 when implemented in software and/or firmware. Specifically, in reference to the switch card endpoint emulation technique 3B00 shown and described as pertaining to FIG. 3B, data packets received at the plurality of switch cards during the enumeration process can be intercepted at a high level of abstraction to facilitate endpoint emulation in software and/or firmware. Process flows for executing the herein disclosed techniques are shown and described as pertaining to FIG. 5A and FIG. 5B.

Figure 5A:
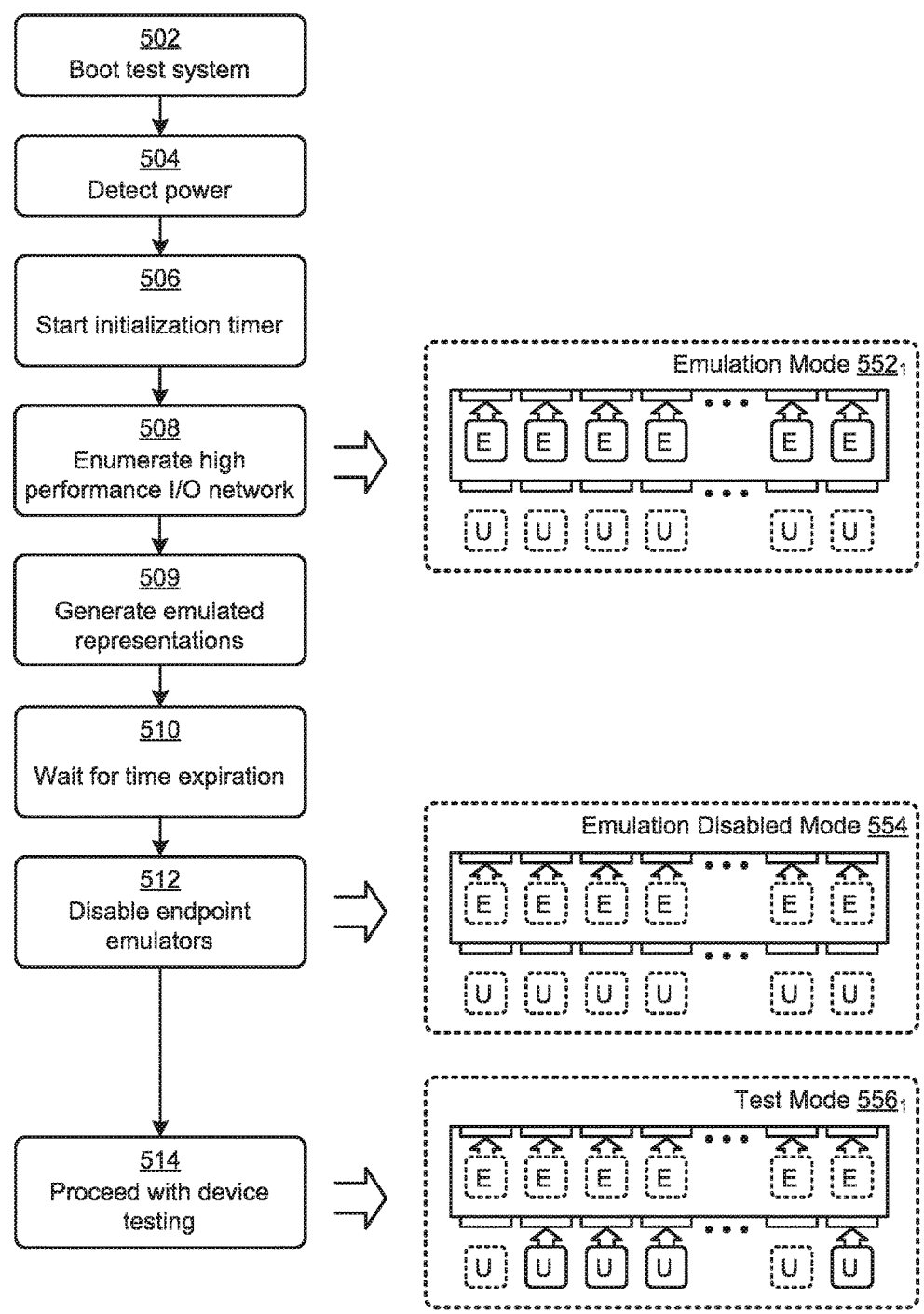
FIG. 5A is a flow diagram illustrating a time-based emulation technique as implemented in systems for initial enumeration of empty endpoint slots using endpoint emulation, according to an embodiment.

FIG. 5A is a flow diagram illustrating a time-based emulation technique 5A00 as implemented in systems for initial enumeration of empty endpoint slots using endpoint emulation. As an option, one or more instances of the time-based emulation technique 5A00 or any aspect thereof may be implemented in the context of the architecture and functionality of the embodiments described herein. Also, the time-based emulation technique 5A00 or any aspect thereof may be implemented in any desired environment.

As shown in FIG. 5A, the process for using a system (e.g., test system) that implements the herein disclosed techniques can commence with booting the test system (at step 502). Certain components in the test system (e.g., switch cards) can detect the boot and/or presence of power (at step 504) that can trigger the start of an initialization timer (at step 506). The test system can then invoke certain operations to enumerate the endpoints (e.g., locations, devices, etc.) in the high performance I/O network (e.g., PCIe fabric) associated with the test system (at step 508). For example, and as illustrated in an emulation mode $552_1$ (e.g., corresponding to the mini-slot endpoint emulation technique 3A00 earlier shown and described as pertaining to FIG. 3A), the test system might have the PCIe endpoint emulators (e.g., the "E" components) present and enabled in the PCIe fabric, while having no PCIe UUTs (e.g., the "U" components) present during the enumeration process. The enumeration process can perform various operations (e.g., allocating address memory) to generate an emulated representation of an endpoint device for each endpoint emulator identified (at step 509) to facilitate testing of PCIe UUTs hot plugged into a respective test slot at any moment in time following completion of the enumeration process.

The test system can then wait for the initialization timer to expire (at step 510). For example, the initialization timer might be set to expire at a time (e.g., 30 seconds) that is expected to exceed the duration of the enumeration process. In certain embodiments, one or more signals can be produced by the test system to indicate the enumeration process is complete. When the enumeration process is complete and/or the timer has expired, the endpoint emulators can be disabled (at step 512). For example, and as illustrated in an emulation disabled mode 554, the test system can disable the PCIe endpoint emulators while having no PCIe UUTs present. The test system can then be used (e.g., by a test system operator) to test various devices using various combinations of test slots (at step 514). For example, and as illustrated in a test mode $556_1$, one or more PCIe UUTs can be inserted (e.g., hot plugged) into a respective test slot for testing.

Figure 5B:
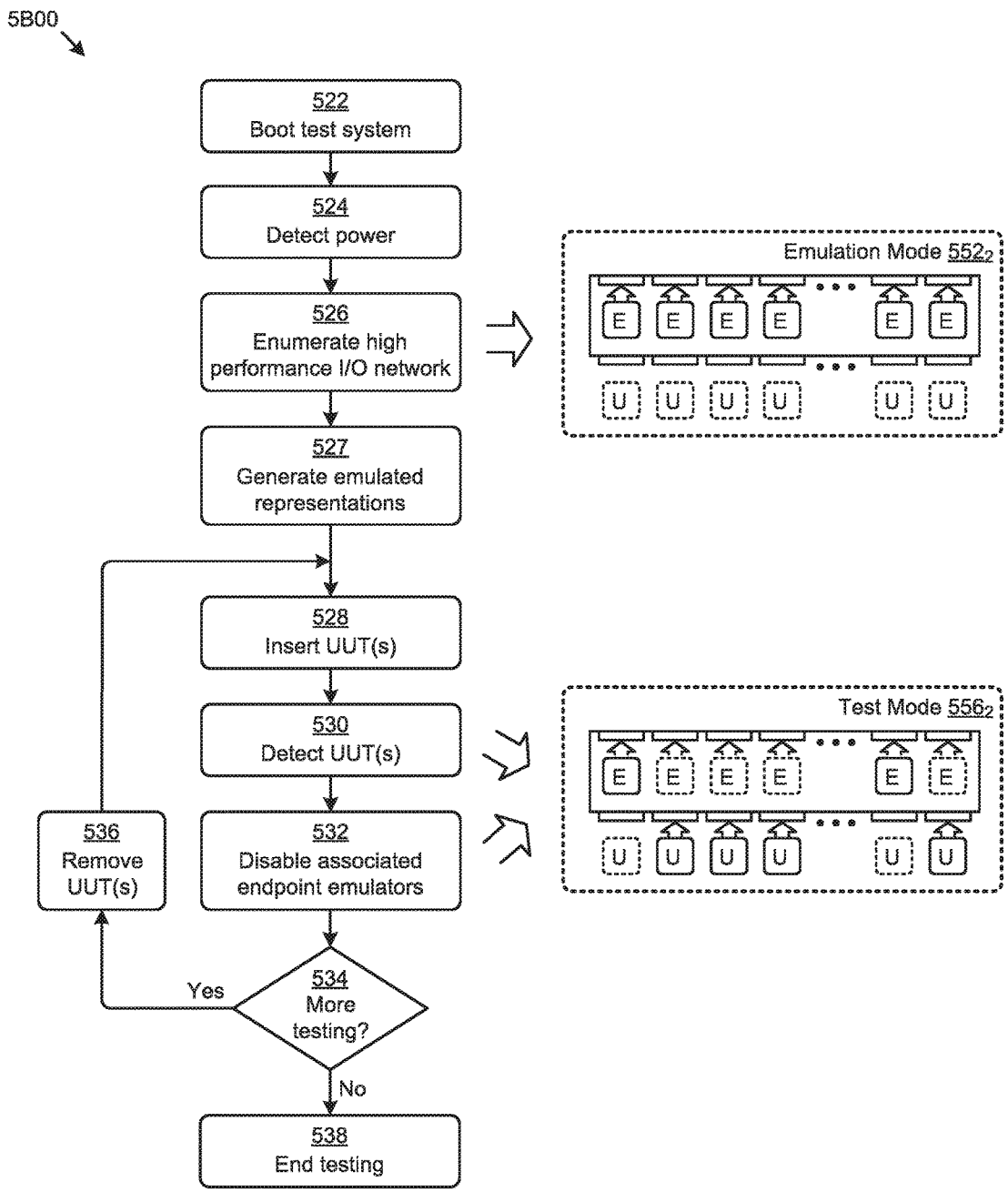
FIG. 5B is a flow diagram illustrating a dynamic emulation technique as implemented in systems for initial enumeration of empty endpoint slots using endpoint emulation, according to an embodiment.

FIG. 5B is a flow diagram illustrating a dynamic emulation technique 5B00 as implemented in systems for initial enumeration of empty endpoint slots using endpoint emulation. As an option, one or more instances of the dynamic emulation technique 5B00 or any aspect thereof may be implemented in the context of the architecture and functionality of the embodiments described herein. Also, the dynamic emulation technique 5B00 or any aspect thereof may be implemented in any desired environment.

As shown in FIG. 5B, the process for using a system (e.g., test system) that implements the herein disclosed techniques can commence with booting the test system (at step 522). Certain components in the test system (e.g., switch cards, CPU, host bridge, etc.) can detect the boot and/or presence of power (at step 524). Responsive to detecting power, certain operations to enumerate the endpoints (e.g., locations, devices, etc.) in the high performance I/O network (e.g., PCIe fabric) associated with the test system can be invoked (at step 526). For example, and as illustrated in an emulation mode 552$_2$ (e.g., corresponding to the mini-slot endpoint emulation technique 3A00 earlier shown and described as pertaining to FIG. 3A), the test system might have the PCIe endpoint emulators (e.g., the "E" components) present and enabled in the PCIe fabric, while having no PCIe UUTs (e.g., the "U" components) present during the enumeration process. The enumeration process can perform various operations (e.g., allocating address memory) to generate an emulated representation of an endpoint device for each endpoint emulator identified (at step 527) to facilitate testing of PCIe UUTs hot plugged into a respective test slot at any moment in time following completion of the enumeration process.

When the enumeration process is complete (e.g., system flag is set), one or more PCIe UUTs can then be inserted into the test slots of the test system (at step 528). The test system can detect the presence of the one or more UUTs (at step 530). Responsive to detecting the UUTs, the test system can disable one or more endpoint emulators associated with the populated test slots (at step 532). For example, and as illustrated in a test mode 556$_2$, the endpoint emulators associated with the slots populated with PCIe UUTs are disabled. When more device testing is to be implemented (see "Yes" path of decision 534), the current UUTs can be removed (at step 536) and at least some of the foregoing steps can be repeated. When no further device testing is to be implemented (see "No" path of decision 534), testing can be completed (at step 538).

Additional Examples

It should be noted that there are alternative ways of implementing the embodiments disclosed herein. Accordingly, the embodiments and examples presented herein are to be considered as illustrative and not restrictive, and the claims are not to be limited to the details given herein, but may be modified within the scope and equivalents thereof.

Additional Embodiments of the Disclosure

Figure 6A:
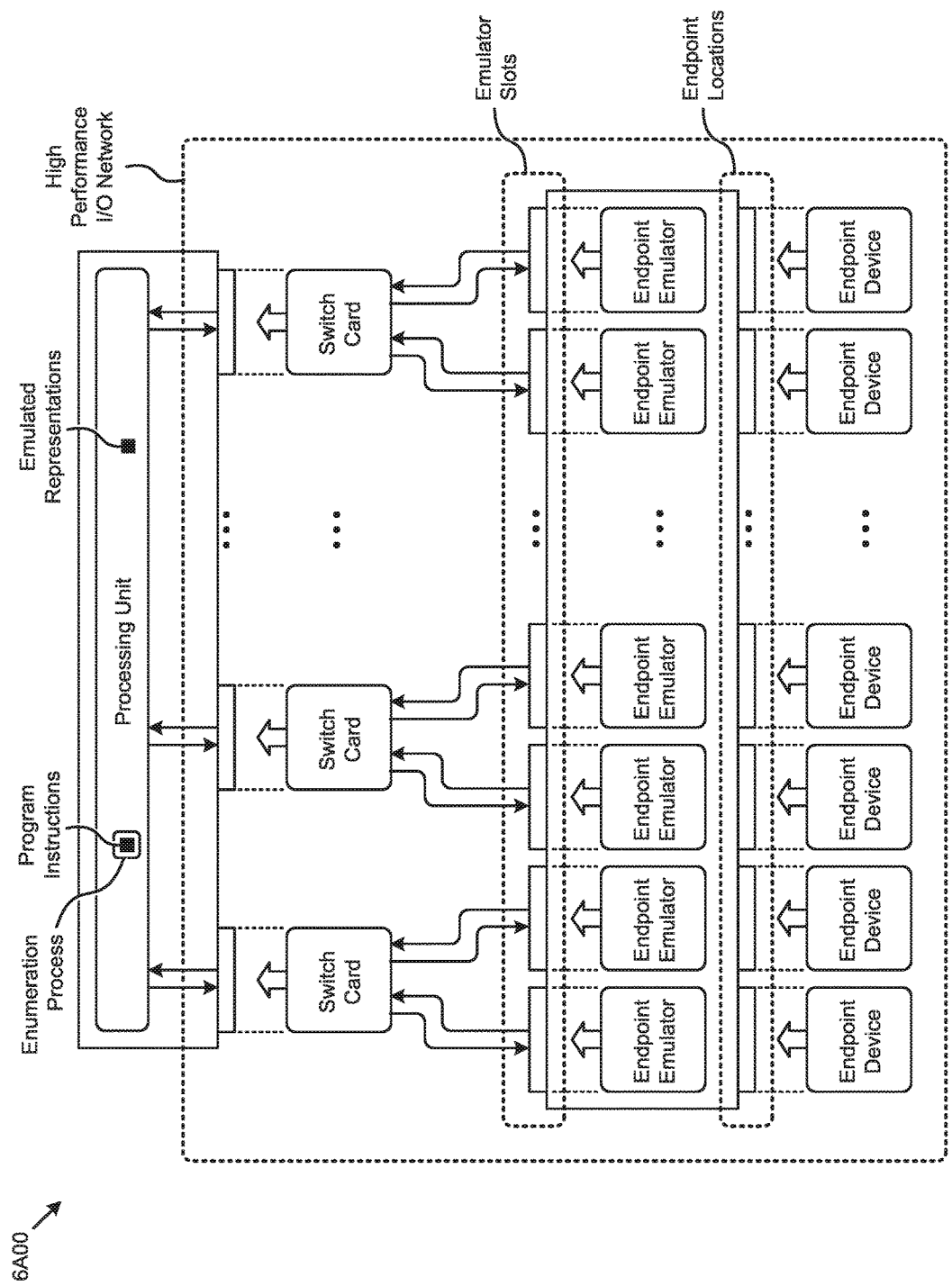
FIG. 6A is a block diagram of a system for initial enumeration of empty endpoint slots using endpoint emulation, according to some embodiments.

FIG. 6A is a block diagram of a system 6A00 for initial enumeration of empty endpoint slots using endpoint emulation. As an option, one or more instances of system 6A00 or any aspect thereof may be implemented in the context of the architecture and functionality of the embodiments described herein. Also, the system 6A00 or any aspect thereof may be implemented in any desired environment.

The system 6A00 shown comprises: at least one processing unit to execute one or more program instructions comprising an enumeration process; one or more endpoint locations in at least one high performance I/O network, the endpoint locations to couple to one or more endpoint devices; and one or more endpoint emulators corresponding to a respective one or more of the endpoint locations, at least one of the endpoint emulators representing at least one of the endpoint devices to facilitate generation of an emulated representation of the at least one of the endpoint devices during the enumeration process.

In certain embodiments, the system 6A00 further comprises: at least one switch card, the switch card coupled to at least one of the endpoint locations and at least one of the endpoint emulators.

Figure 6B:
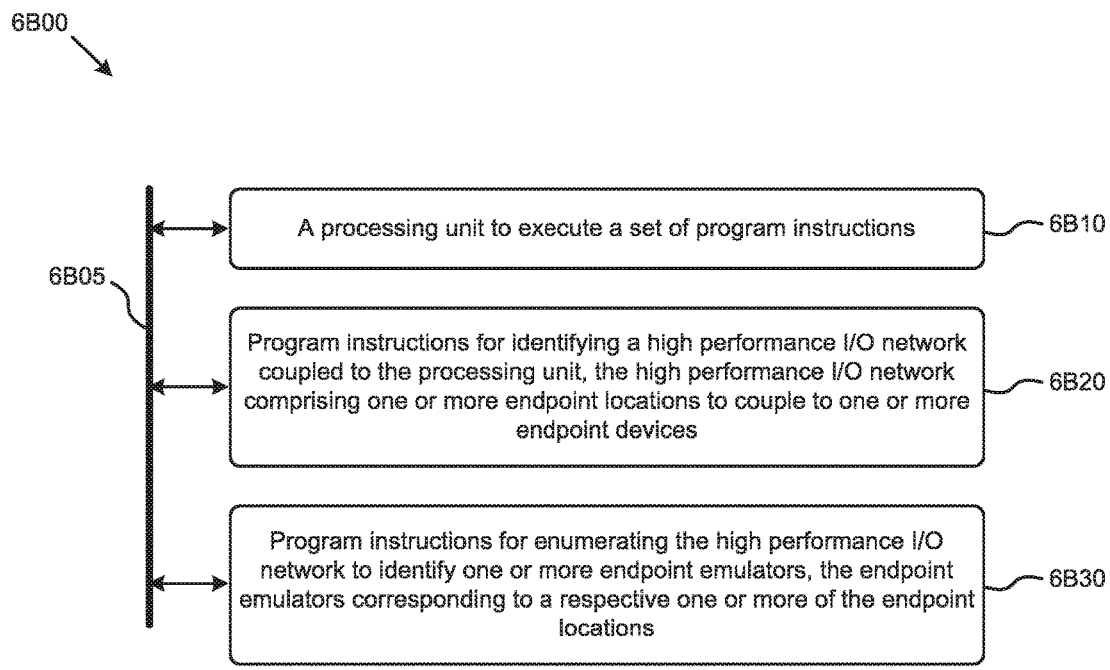
FIG. 6B and FIG. 6C depict systems as arrangements of computing modules that are interconnected so as to operate cooperatively to implement certain of the herein-disclosed embodiments.

FIG. 6B depicts a system 6B00 as an arrangement of computing modules that are interconnected so as to operate cooperatively to implement certain of the herein-disclosed embodiments. The partitioning of system 6B00 is merely illustrative and other partitions are possible.

The system 6B00 comprises at least one processor and at least one memory, the memory serving to store program instructions corresponding to the operations of the system. As shown, an operation can be implemented in whole or in part using program instructions accessible by a module. The modules are connected to a communication path 6B05, and any operation can communicate with other operations over communication path 6B05. The modules of the system can, individually or in combination, perform operations within system 6B00. Any operations performed within system 6B00 may be performed in any order unless as may be specified in the claims.

The shown embodiment in FIG. 6B implements a portion of a computer system, shown as system 6B00, comprising a processing unit to execute a set of program instructions (see module 6B10) and modules for accessing memory to hold program instructions to perform: identifying a high performance I/O network coupled to the processing unit, the high performance I/O network comprising one or more endpoint locations to couple to one or more endpoint devices (see module 6B20); and enumerating the high performance I/O network to identify one or more endpoint emulators, the endpoint emulators corresponding to a respective one or more of the endpoint locations (see module 6B30).

Figure 6C:
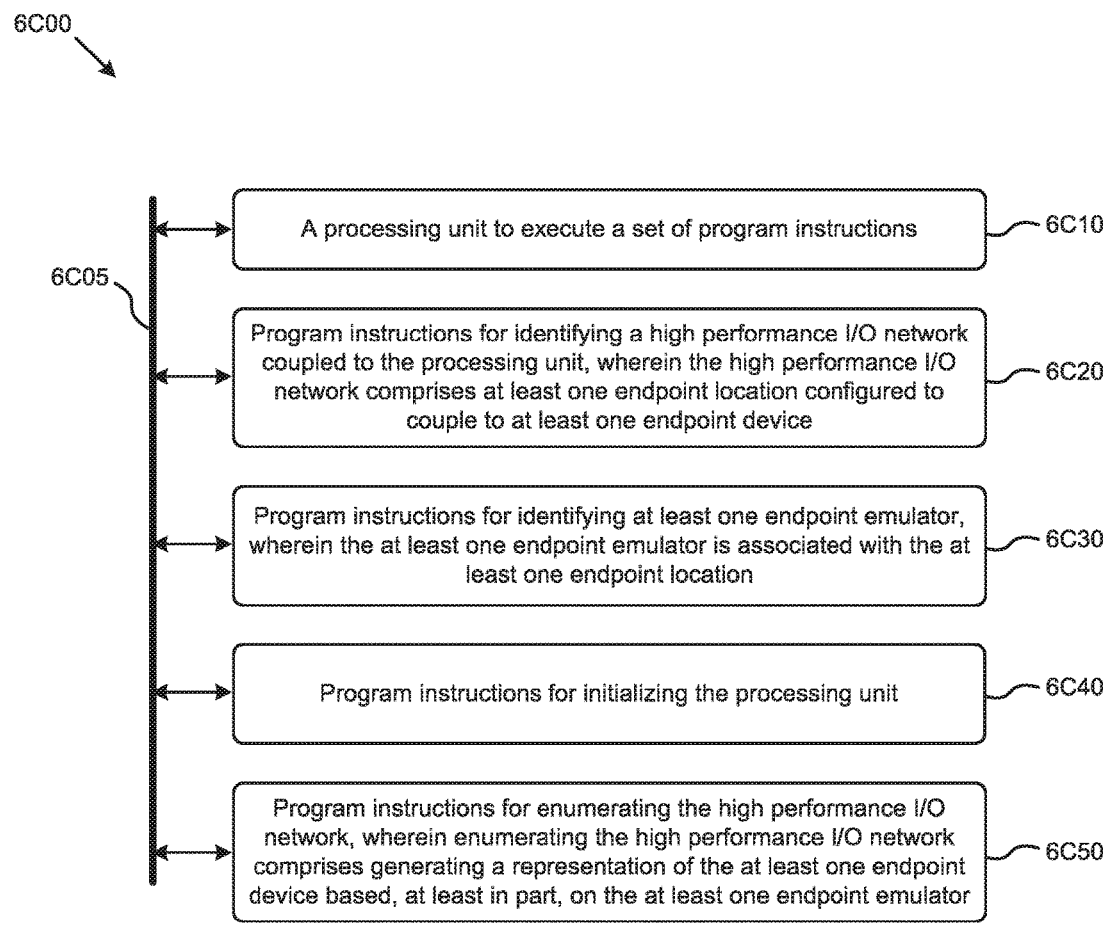

FIG. 6C depicts a system 6C00 as an arrangement of computing modules that are interconnected so as to operate cooperatively to implement certain of the herein-disclosed embodiments. The partitioning of system 6C00 is merely illustrative and other partitions are possible.

The system 6C00 comprises at least one processor and at least one memory, the memory serving to store program instructions corresponding to the operations of the system. As shown, an operation can be implemented in whole or in part using program instructions accessible by a module. The modules are connected to a communication path 6C05, and any operation can communicate with other operations over communication path 6C05. The modules of the system can, individually or in combination, perform operations within system 6C00. Any operations performed within system 6C00 may be performed in any order unless as may be specified in the claims.

The shown embodiment in FIG. 6C implements a portion of a computer system, shown as system 6C00, comprising a processing unit to execute a set of program instructions (see module 6C10) and modules for accessing memory to hold program instructions to perform: identifying a high performance I/O network coupled to the processing unit, wherein the high performance I/O network comprises at least one endpoint location configured to couple to at least one endpoint device (see module 6C20); identifying at least one endpoint emulator, wherein the at least one endpoint emulator is associated with the at least one endpoint location (see module 6C30); initializing the processing unit (see module 6C40); and enumerating the high performance I/O network, wherein enumerating the high performance I/O network comprises generating a representation of the at least one endpoint device based, at least in part, on the at least one endpoint emulator (see module 6C50).

Additional System Architecture Examples

Figure 7A:
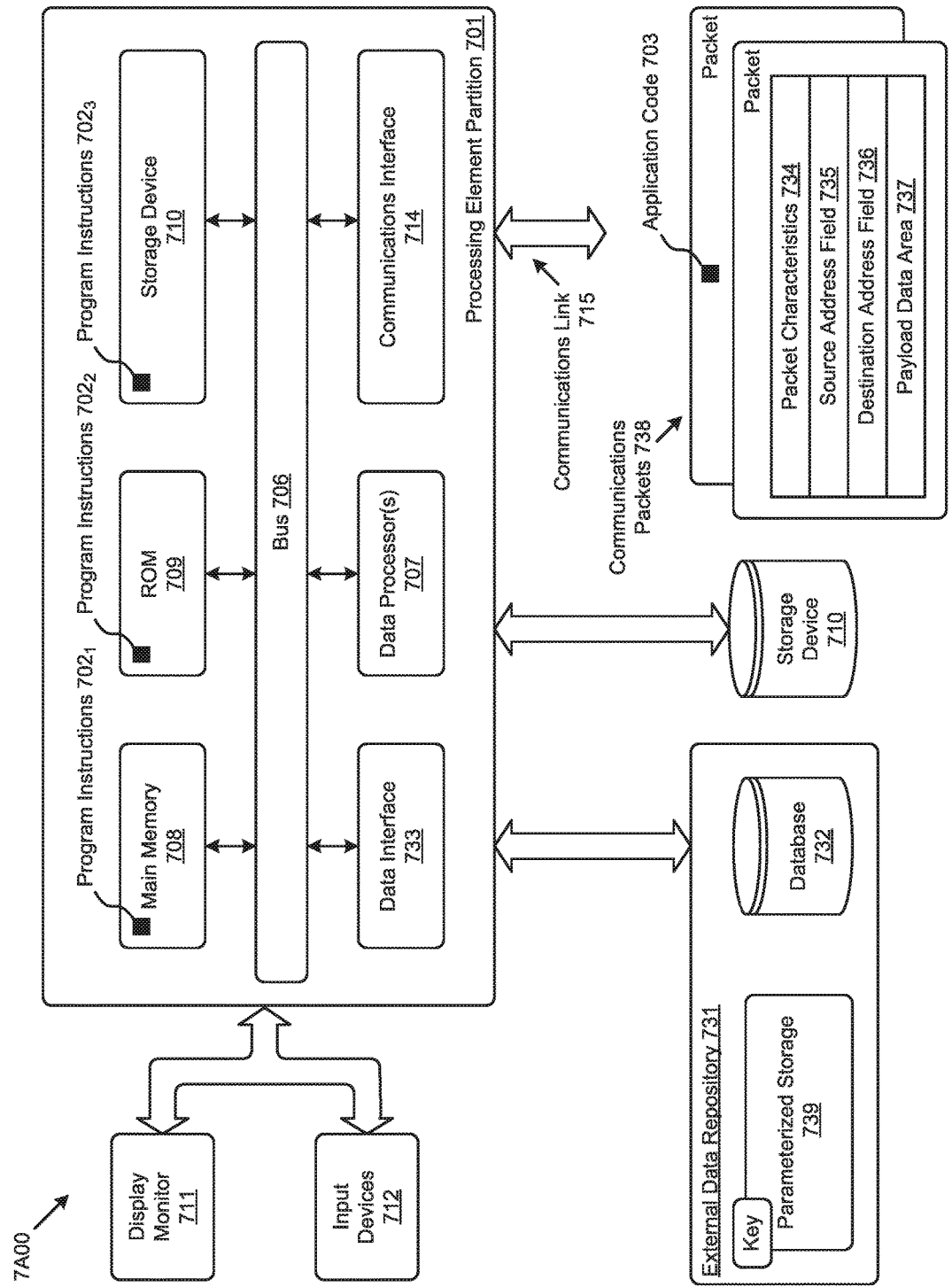
FIG. 7A and FIG. 7B depict exemplary architectures of components suitable for implementing embodiments of the present disclosure and/or for use in the herein-described environments.

FIG. 7A depicts a block diagram of an instance of a computer system 7A00 suitable for implementing embodiments of the present disclosure. Computer system 7A00 includes a bus 706 or other communication mechanism for communicating information. The bus interconnects subsystems and devices such as a CPU, or a multi-core CPU (e.g., data processor 707), a system memory (e.g., main memory 708, or an area of random access memory (RAM)), a non-volatile storage device or non-volatile storage area (e.g., read-only memory or ROM 709), an internal storage device 710 or external storage device 713 (e.g., magnetic or optical), a data interface 733, a communications interface 714 (e.g., PHY, MAC, Ethernet interface, modem, etc.). The aforementioned components are shown within processing element partition 701, however other partitions are possible. The shown computer system 7A00 further comprises a display 711 (e.g., CRT or LCD), various input devices 712 (e.g., keyboard, cursor control), and an external data repository 731.

According to an embodiment of the disclosure, computer system 7A00 performs specific operations by data processor 707 executing one or more sequences of one or more program instructions contained in a memory. Such instructions (e.g., program instructions $702_1$, program instructions $702_2$, program instructions $702_3$, etc.) can be contained in or can be read into a storage location or memory from any computer readable/usable medium such as a static storage device or a disk drive. The sequences can be organized to be accessed by one or more processing entities configured to execute a single process or configured to execute multiple concurrent processes to perform work. A processing entity can be hardware-based (e.g., involving one or more cores) or software-based, and/or can be formed using a combination of hardware and software that implements logic, and/or can carry out computations and/or processing steps using one or more processes and/or one or more tasks and/or one or more threads or any combination thereof.

According to an embodiment of the disclosure, computer system 7A00 performs specific networking operations using one or more instances of communications interface 714. Instances of the communications interface 714 may comprise one or more networking ports that are configurable (e.g., pertaining to speed, protocol, physical layer characteristics, media access characteristics, etc.) and any particular instance of the communications interface 714 or port thereto can be configured differently from any other particular instance. Portions of a communication protocol can be carried out in whole or in part by any instance of the communications interface 714, and data (e.g., packets, data structures, bit fields, etc.) can be positioned in storage locations within communications interface 714, or within system memory, and such data can be accessed (e.g., using random access addressing, or using direct memory access DMA, etc.) by devices such as data processor 707.

The communications link 715 can be configured to transmit (e.g., send, receive, signal, etc.) any types of communications packets 738 comprising any organization of data items. The data items can comprise a payload data area 737, a destination address 736 (e.g., a destination IP address), a source address 735 (e.g., a source IP address), and can include various encodings or formatting of bit fields to populate the shown packet characteristics 734. In some cases, the packet characteristics include a version identifier, a packet or payload length, a traffic class, a flow label, etc. In some cases, the payload data area 737 comprises a data structure that is encoded and/or formatted to fit into byte or word boundaries of the packet.

In certain embodiments, hard-wired circuitry may be used in place of or in combination with software instructions to implement aspects of the disclosure. Thus, embodiments of the disclosure are not limited to any specific combination of hardware circuitry and/or software. In embodiments, the term "logic" shall mean any combination of software or hardware that is used to implement all or part of the disclosure.

The term "computer readable medium" or "computer usable medium" as used herein refers to any medium that participates in providing instructions to data processor 707 for execution. Such a medium may take many forms including, but not limited to, non-volatile media and volatile media. Non-volatile media includes, for example, optical or magnetic disks such as disk drives or tape drives. Volatile media includes dynamic memory such as a random access memory.

Common forms of computer readable media include, for example, floppy disk, flexible disk, hard disk, magnetic tape, or any other magnetic medium; CD-ROM or any other optical medium; punch cards, paper tape, or any other physical medium with patterns of holes; RAM, PROM, EPROM, FLASH-EPROM, or any other memory chip or cartridge, or any other non-transitory computer readable medium. Such data can be stored, for example, in any form of external data repository 731, which in turn can be formatted into any one or more storage areas, and which can comprise parameterized storage 739 accessible by a key (e.g., filename, table name, block address, offset address, etc.).

Execution of the sequences of instructions to practice certain embodiments of the disclosure are performed by a single instance of the computer system 7A00. According to certain embodiments of the disclosure, two or more instances of computer system 7A00 coupled by a communications link 715 (e.g., LAN, PTSN, or wireless network) may perform the sequence of instructions required to practice embodiments of the disclosure using two or more instances of components of computer system 7A00.

The computer system 7A00 may transmit and receive messages such as data and/or instructions organized into a data structure (e.g., communications packets). The data structure can include program instructions (e.g., application code 703), communicated through communications link 715 and communications interface 714. Received program code may be executed by data processor 707 as it is received and/or stored in the shown storage device or in or upon any other non-volatile storage for later execution. Computer system 7A00 may communicate through a data interface 733 to a database 732 on an external data repository 731. Data items in a database can be accessed using a primary key (e.g., a relational database primary key).

The processing element partition 701 is merely one sample partition. Other partitions can include multiple data processors, and/or multiple communications interfaces, and/or multiple storage devices, etc. within a partition. For example, a partition can bound a multi-core processor (e.g., possibly including embedded or co-located memory), or a partition can bound a computing cluster having plurality of computing elements, any of which computing elements are connected directly or indirectly to a communications link. A first partition can be configured to communicate to a second partition. A particular first partition and particular second partition can be congruent (e.g., in a processing element array) or can be different (e.g., comprising disjoint sets of components).

A module as used herein can be implemented using any mix of any portions of the system memory and any extent of hard-wired circuitry including hard-wired circuitry embodied as a data processor 707. Some embodiments include one or more special-purpose hardware components (e.g., power control, logic, sensors, transducers, etc.). A module may include one or more state machines and/or combinational logic used to implement or facilitate the operational and/or performance characteristics pertaining to data access authorization for dynamically generated database structures.

Various implementations of the database 732 comprise storage media organized to hold a series of records or files such that individual records or files are accessed using a name or key (e.g., a primary key or a combination of keys and/or query clauses). Such files or records can be organized into one or more data structures (e.g., data structures used to implement or facilitate aspects of data access authorization for dynamically generated database structures). Such files or records can be brought into and/or stored in volatile or non-volatile memory.

Figure 7B:
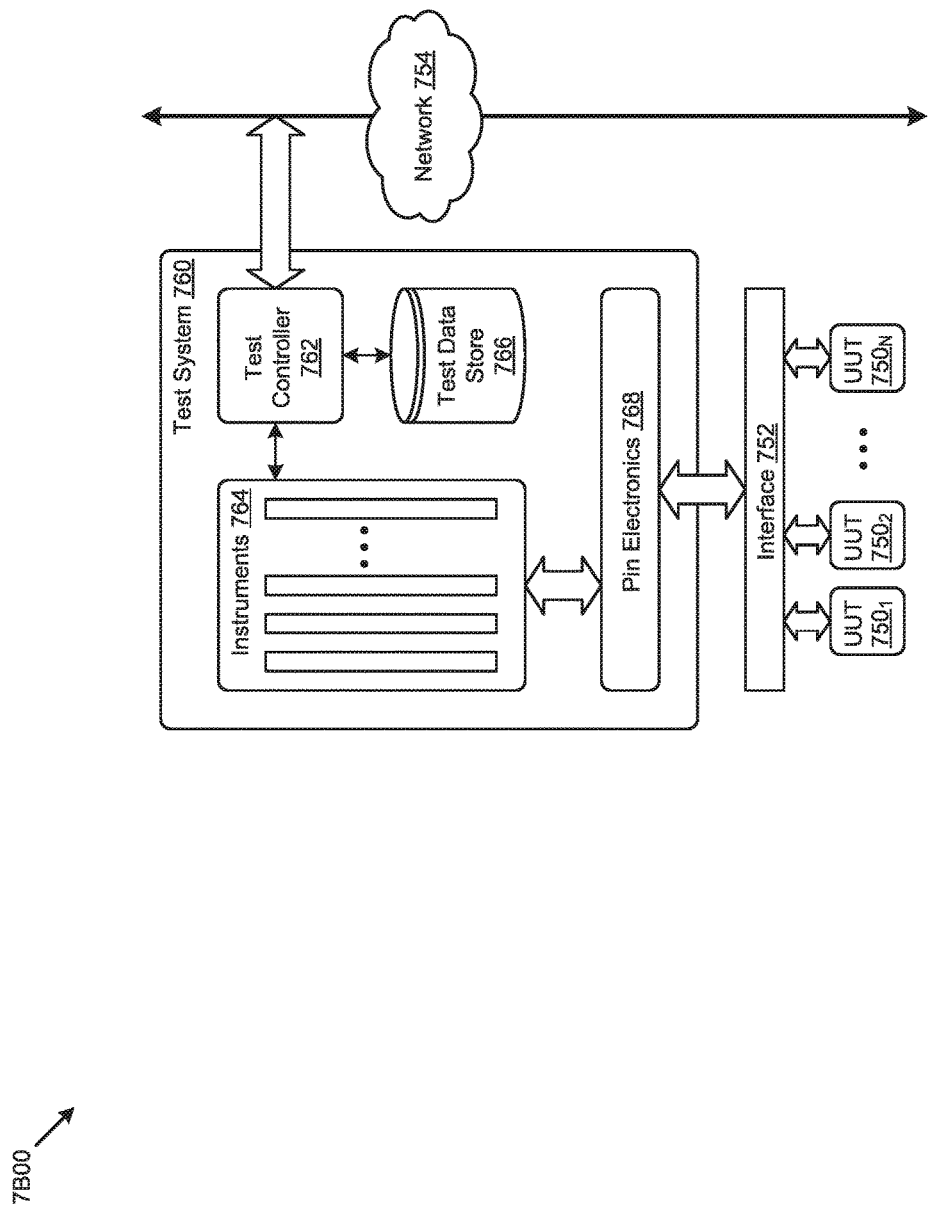

FIG. 7B depicts a block diagram 7B00 of an instance of a test system 760 suitable for implementing embodiments of the present disclosure. Test system 760 comprises a test controller 762, a set of instruments 764, a test data store 766, and a set of pin electronics 768. The test controller 762 can be configured (e.g., through program instructions stored in the test data store 766) to execute a sequence of tests for one or more units under test or UUTs (e.g., UUT 750$_1$, UUT 750$_2$, ..., UUT 750$_N$). The tests can use the instruments 764 (e.g., digital I/O, waveform generators, waveform digitizers, etc.) to transmit and receive test signals to and from, respectively, the UUTs. The pin electronics 768 can condition (e.g., buffer, amplify, fan out, multiplex, etc.) the test signals transmitted and received. The interface 752 can provide electrical and/or mechanical interface mechanisms (e.g., pogo pins, probes, sockets, signal routing, etc.) to couple the UUTs to the pin electronics 768. Test results can be captured by the test controller 762 and stored in the test data store 766. Calibration settings, configuration settings, and/or other data can also be stored in the test data store 766. As shown, the test system 760 can communicate with other test systems and computing devices using a network 754 (e.g., a wireless network, a wide area network (WAN), a local area network (LAN), the Internet, an intranet, a private network, etc.). In some cases, the test system 760 can represent a system-level test system (e.g., for testing PCIe devices). In such cases, for example, the test controller 762 might be a CPU, the instruments 764 and pin electronics 768 might comprise any combination of system communications protocol logic and signals (e.g., generated by the CPU and/or associated drivers and/or controllers), and the interface 752 might comprise system slots and/or sockets associated with a certain standards specification (e.g., PCI, PCIe, USB, SATA, Ethernet, etc.).

In the foregoing specification, the disclosure has been described with reference to specific embodiments thereof. It will, however, be evident that various modifications and changes may be made thereto without departing from the broader spirit and scope of the disclosure. For example, the above-described process flows are described with reference to a particular ordering of process actions. However, the ordering of many of the described process actions may be changed without affecting the scope or operation of the disclosure. The specification and drawings are, accordingly, to be regarded in an illustrative sense rather than in a restrictive sense.

What is claimed is:

1. A method comprising:
   accessing at least one processing unit to execute one or more program instructions to perform operations comprising:
   identifying a high performance I/O network coupled to the processing unit, the high performance I/O network comprising one or more endpoint locations to couple to one or more endpoint devices;
   enumerating the high performance I/O network to identify one or more endpoint emulators, the endpoint emulators corresponding to a respective one or more of the endpoint locations; and
   disabling, responsive to enumerating the high performance I/O network, at least one endpoint emulator from the endpoint emulators.

2. The method of claim 1, further comprising generating one or more emulated representations of the endpoint devices based at least in part on a respective one or more of the endpoint emulators.

3. The method of claim 2, wherein generating the emulated representations comprises allocating at least one address space based at least in part on at least one of, one or more of the endpoint emulators, or one or more of the endpoint locations.

4. The method of claim 1, further comprising enabling, after the disabling, the at least one endpoint emulator responsive to detecting that at least one endpoint location from the endpoint locations corresponding to the at least one endpoint emulator is unpopulated.

5. The method of claim 1, wherein the at least one endpoint emulator is disabled responsive to detecting that at least one endpoint device from the endpoint devices is coupled to a respective at least one endpoint location from the endpoint locations, the respective at least one endpoint location corresponding to the at least one endpoint emulator.

6. The method of claim 5, wherein the endpoint device is a unit under test.

7. The method of claim 1, wherein at least one of the endpoint locations is at least one of, a card slot, or a test slot.

8. The method of claim 1, wherein at least one of the endpoint emulators is a card plugged into an emulator slot.

9. The method of claim 1, wherein at least one of the endpoint emulators comprises at least one of, one or more chips, or firmware.

10. A system comprising:
    at least one processing unit to execute one or more program instructions comprising an enumeration process;
    one or more endpoint locations in at least one high performance I/O network, the endpoint locations to couple to one or more endpoint devices; and
    one or more endpoint emulators corresponding to a respective one or more of the endpoint locations, at least one of the endpoint emulators representing at least one of the endpoint devices to facilitate generation of an emulated representation of the at least one of the endpoint devices during the enumeration process, wherein at least one of the endpoint emulators is disabled in response to the enumeration process.

11. The system of claim 10, further comprising at least one switch card, the switch card coupled to at least one of the endpoint locations and at least one of the endpoint emulators.

12. The system of claim 10, wherein at least one of the endpoint locations is a card slot.

13. The system of claim 10, wherein at least one of the endpoint emulators is a card plugged into an emulator slot.

14. The system of claim 10, wherein at least one of the endpoint emulators comprises at least one of, one or more chips, or firmware.

15. A test system comprising:
- at least one processing unit to execute one or more program instructions comprising an enumeration process;
- at least one high performance I/O network coupled to the processing unit, the high performance I/O network comprising one or more endpoint locations;
- one or more test slots corresponding to a respective one or more of the endpoint locations, the test slots to couple to one or more high performance I/O devices to facilitate testing of the high performance I/O devices by the test system; and
- one or more endpoint emulators corresponding to a respective one or more of the test slots, at least one of the endpoint emulators representing at least one of the high performance I/O devices during the enumeration process, wherein at least one of the endpoint emulators is disabled in response to the enumeration process.

16. The test system of claim 15, further comprising at least one switch card, the switch card coupled to at least one of the test slots and at least one of the endpoint emulators.

17. The test system of claim 15, wherein at least one of the test slots is a card slot.

18. The test system of claim 15, wherein at least one of the test slots couples to at least one of, a PCIe device, a PCI device, an NVMe device, or an SSD device.

19. The test system of claim 15, wherein at least one of the endpoint emulators is a card plugged into an emulator slot.

20. The test system of claim 15, wherein at least one of the endpoint emulators comprises at least one of, one or more chips, or firmware.

* * * * *